US005164681A

United States Patent [19]

Nishimura

[11] Patent Number: 5,164,681

[45] Date of Patent: Nov. 17, 1992

[54] VOLTAGE-CURRENT CONVERSION CIRCUIT

[75] Inventor: Yasushi Nishimura, Tokyo, Japan

[73] Assignee: Pioneer Electronic Corporation, Tokyo, Japan

[21] Appl. No.: 804,420

[22] Filed: Dec. 10, 1991

[30] Foreign Application Priority Data

Apr. 15, 1991 [JP] Japan .................................. 3-173506

[51] Int. Cl.[5] .................................. H03F 1/32

[52] U.S. Cl. .................................. 330/288; 330/149

[58] Field of Search .................................. 307/296.1, 292; 323/315, 316; 330/149, 288, 296

[56] References Cited

U.S. PATENT DOCUMENTS

| | | | |
|---|---|---|---|
| 4,380,740 | 4/1983 | Kaplan | 330/288 |
| 4,814,724 | 3/1989 | Tanigawa | 330/288 |
| 5,057,792 | 10/1991 | Gay | 330/288 |

FOREIGN PATENT DOCUMENTS

| | | |
|---|---|---|
| 2333674A1 | 7/1973 | Fed. Rep. of Germany . |
| 3027761C2 | 2/1981 | Fed. Rep. of Germany . |
| 3213838C2 | 10/1983 | Fed. Rep. of Germany . |
| 813386 | 6/1978 | U.S.S.R. . |
| 756386 | 10/1978 | U.S.S.R. . |
| 853623 | 11/1979 | U.S.S.R. . |
| 1096622 | 10/1982 | U.S.S.R. . |
| 1076887 | 1/1983 | U.S.S.R. . |

OTHER PUBLICATIONS

Fabre, A., Dual Translinear Voltage/Current Converter, Electronics Letters, Nov. 24, 1983, pp. 1030, 1031.

*Primary Examiner*—Steven Mottola

*Attorney, Agent, or Firm*—Sughrue, Mion, Zinn, Macpeak & Seas

[57] ABSTRACT

A voltage-current conversion circuit comprises a transistor (Q1) on the input side whose emitter is employed as the input terminal (IN), and a transistor (Q2) on the output side whose base is connected to the base of the transistor (Q1), and the collector current and the emitter current of the transistor (Q1) on the input side are made equal to the collector current of the transistor (Q2) on the output side with the aid of current mirrors circuits (1 and 2). Hence, the transistors on the input and output sides are equal in base-emitter voltage to each other, and the non-linear distortion is therefore eliminated. In addition, the inflow or outflow of current from the input voltage source is zeroed, so that a high input impedance is obtained.

4 Claims, 4 Drawing Sheets

VOLTAGE-CURRENT CONVERSION CIRCUIT

BACKGROUND OF THE INVENTION

This invention relates to a voltage-current conversion circuit less in non-linearity distortion.

A voltage-current conversion circuit is to output current which is linear to voltage applied thereto. A simple example of the voltage-current conversion circuit is as shown in FIG. 3. In the circuit, the base of a transistor Q is the input terminal IN of the circuit, and the emitter of the transistor Q is grounded through a load resistor R, and the collector is connected to a positive power source Vcc, thus forming an emitter follower circuit. In the circuit thus arranged, the following Equation (1) is established:

$$I_E = \frac{V_i - V_{BE}}{R} \quad (1)$$

where Vi is the input voltage applied to the input terminal IN, $I_E$ is the Current flowing in the load resistor R; that is, the emitter current, and $V_{BE}$ is the base-emitter voltage of the transistor Q.

In addition, the following Equation (2) is established:

$$V_{BE} = \frac{KT}{q} \ln \frac{I_E}{I_S} \quad (2)$$

where $I_s$ is the saturation current due to the diode characteristic of the base-emitter of the transistor Q, q is the electron charge ($1.602 \times 10^{-19}$C), K is the Boltzmann's constant ($1{,}38 \times 10^{-23}$J/K), and T is the absolute temperature [° K.].

Hence, the base-emitter voltage $V_{BE}$ is not linear to the emitter current $I_E$, and accordingly the characteristic indicated by Equation (1) is the non-linearity characteristic because of the non-linearity characteristic of the base-emitter voltage $V_{BE}$. Assuming that the current amplification factor of the transistor Q is represented by $h_{fe}$, the input impedance of the circuit is about $h_{fe}$ times of the load resistance R. However, it is still insufficient in the case where high input impedance is required.

In order to overcome this difficulty, a circuit as shown in FIG. 4 has been provided in which negative feedback is provided by an operational amplifier 40. The non-inversion input terminal of the operational amplifier 40 is employed as the input terminal of the circuit, and the output terminal of the amplifier 40 is connected to the base of the transistor Q, so that the emitter voltage of the transistor Q; i.e., the voltage applied to the load resistor R is fed-back. If it is assumed that the operational amplifier has the ideal characteristic; that is, the input impedance is infinite, the input offset voltage is zero, and the open loop gain is infinite, then the current $I_R$ flowing in the load resistor R is:

$$I_R = \frac{V_i}{R} \quad (3)$$

Thus, no non-linear distortion is caused which is due to the non-linearity of the base-emitter voltage $V_{BE}$, and the input impedance can be made infinite. However, in practice, no operational amplifier ideal in characteristic is available. If, in order to obtain sufficient effects, it were intended to make the characteristic of an operational amplifier as ideal as possible, then the resultant operational amplifier would be unavoidably intricate in internal structure, resulting in an increase in manufacturing cost.

As was described above, the conventional voltage-current conversion circuit is disadvantageous in that the output voltage is distorted because of the non-linear characteristic of the base-emitter of the transistor, and that the distortion cannot be decreased without an intricate circuit such as an operational amplifier, and yet it is impossible to completely eliminate the distortion.

SUMMARY OF THE INVENTION

Accordingly, an object of the invention is to eliminate the above-described difficulties accompanying a conventional voltage-current conversion circuit. More specifically, an object of the invention is to provide a voltage-current conversion circuit simple in arrangement which is high in input impedance, and is prevented from the generation of non-linear distortion.

In order to achieve the foregoing object of the invention, a voltage-current conversion circuit comprises: a first transistor whose emitter is employed as an input terminal; a second transistor the base of which is connected to the base of the first transistor and the emitter of which is connected to a predetermined load; a first current mirror circuit which, with reference to a current on the collector of the second transistor, supplies currents to the collector of the first transistor and a first current source which are equal to the current on the collector of the second transistor; a second current mirror circuit which, with reference to a current flowing in a second current source, supplies a current to the emitter of the first transistor which is equal to the current flowing in the second source, the second current source being connected in series to the first current source so that the same current flows in the first and second current sources, and the first and second transistors being equal in emitter potential to each other.

In the voltage-current conversion circuit of the invention, the base of the first transistor on the input side is connected to the base of the second transistor on the output side, the current equal to the collector current of the second transistor is supplied, as a collector current, to the first transistor with the aid of the first current mirror circuit, and the current equal to that current is applied, as an emitter current, to the first transistor with the aid of the first and second current sources and the second current mirror circuit. Hence, the transistors on the input and output sides are equal in emitter current, and accordingly in base-emitter voltage. As a result, the base-emitter voltages causing the non-linear distortion are canceled out by each other, thus not affecting the load; that is, the output current at the load is proportional to the input voltage and free from non-linear distortion.

Furthermore, at the emitter of the transistor on the input side, the inflow and outflow of current from the input voltage source becomes zero, so that the input impedance can be infinite.

DESCRIPTION OF THE PREFERRED EMBODIMENTS

Figure 1:
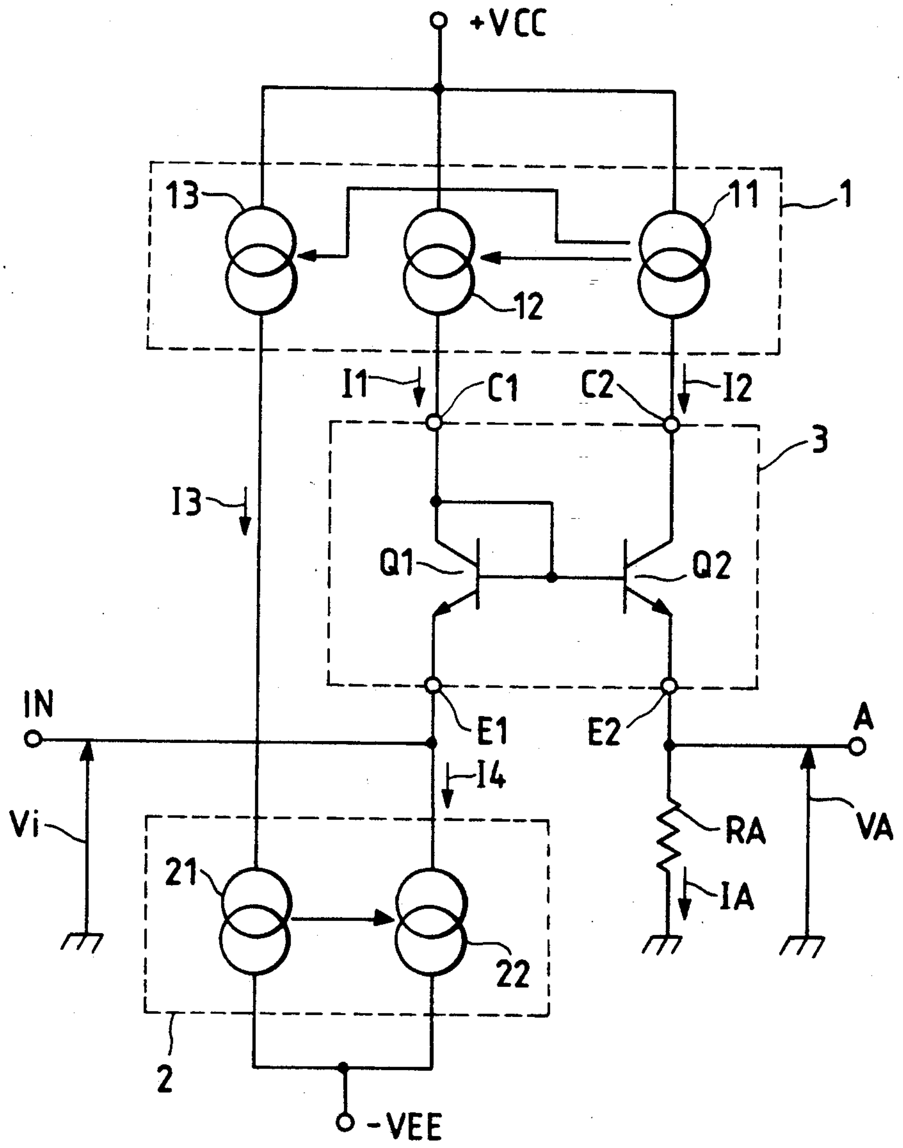
FIG. 1 is a circuit diagram for a description of the operating principle of this invention.

FIG. 1 is a circuit diagram for a description of the operating principle of this invention. The circuit shown in FIG. 1 employs a pair of NPN transistors. In the following description, it is assumed that the pair of transistors are equal in characteristic, and sufficiently high in $h_{fe}$, and that the base currents can be disregarded.

In FIG. 1, the emitter of a first transistor Q1 is employed as the input terminal of the circuit, and the collector is connected through a current source 12 to a positive power source +Vcc. The base of a second transistor Q2 is connected to the base of the first transistor Q1, the emitter is employed as the output terminal of the circuit and is grounded through a load resistor RA, and the collector is connected to a current source 11 to the positive power source +Vcc. The collector and base of the transistor Q1 are connected to each other. In the case where the transistors Q1 and Q2 are equal in emitter potential, they can be considered to form a current mirror circuit in which the side of the transistor Q1 serves as a reference. The positive power source +Vcc is connected a series circuit of current sources 13 and 21 to a negative power source VEE, so that one and the same current I3 flows in these current sources. The current sources 11, 12 and 13 constitute a first current mirror circuit 1. With the current I2 of the current source 11 as a reference, the currents equal to the current I2 are supplied to the current sources 12 and 13.

On the other hand, in the circuit, the current source 21 and a current source 22 constitute a second current mirror circuit 2. With the current I3 of the current source 21, the current equal to the current I3 is supplied to the current source 22.

In the circuit, I2=I1=I3, and I3=I4, and therefore I1=I4, and no current flows in or out through the input terminal IN; that is, the input impedance is infinite. As was described above, the transistors Q1 and Q2 can be considered to form a current mirror circuit with the side of the transistor Q1 as a reference. And, under the condition that the base currents can be disregarded because $h_{fe}$ is sufficiently large, the emitter currents Il and I2 are made equal. Therefore, the emitter potentials must be also equal to each other. This can be understood from the fact that the transistors are equal in base-emitter voltage $V_{BE}$ according to Equation (2). That is, in the circuit shown in FIG. 1, where Vi represents the voltage at the input terminal, and VA represents the voltage at the output terminal A. The circuit operates as a voltage-current conversion circuit in which the current IA flowing in the load resistor RA is proportional to Vi. In this connection, it should be noted that, in the circuit shown in FIG. 1, Vi is the positive voltage.

Figure 2:
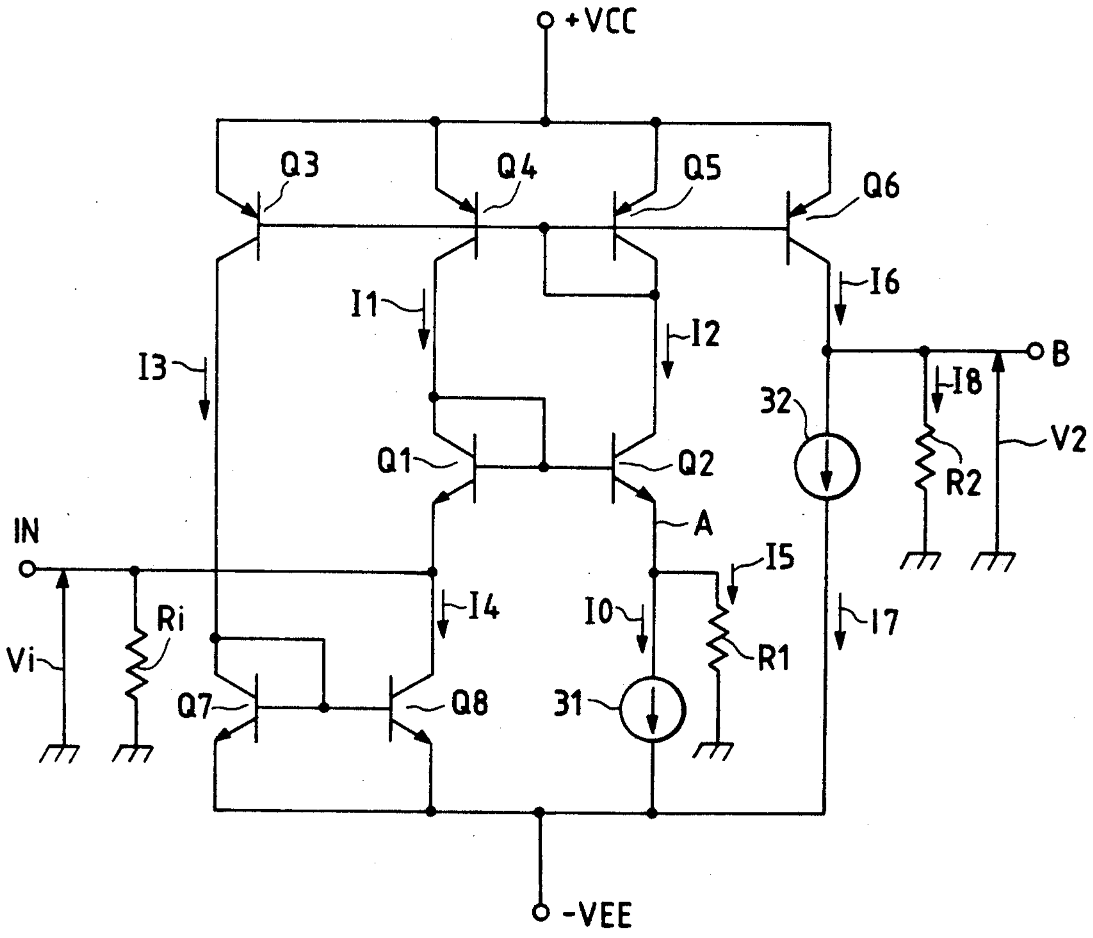
FIG. 2 is a circuit diagram showing an example of a voltage-current conversion circuit according to this invention.
Figure 3:
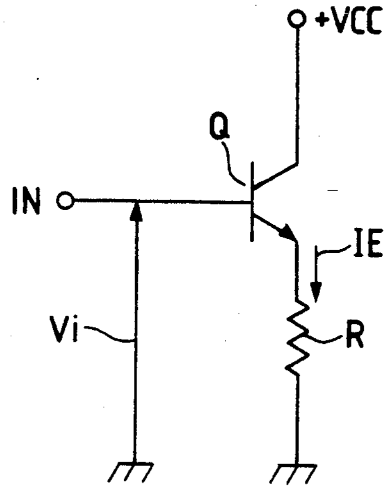
FIG. 3 is a circuit diagram showing an example of a conventional voltage-current conversion circuit.
Figure 4:
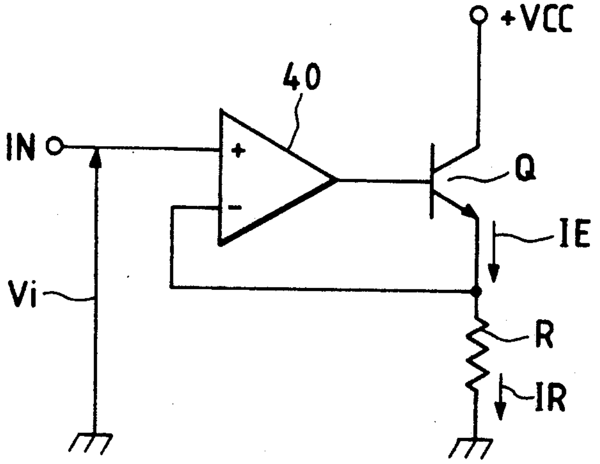
FIG. 4 is a circuit diagram showing another example of the conventional voltage-current conversion circuit.

FIG. 2 shows an example of a voltage-current conversion circuit according to the principle described above with reference to FIG. 1 which constitutes a first embodiment of the invention. The embodiment handles positive and negative input voltages, and applies the output current to external equipment.

In FIG. 2, parts corresponding functionally to those which have been described with reference to FIG. 1 are therefore designated by the same reference numerals or characters. The bases of transistors Q3, Q4, Q5 and Q6 are connected together, and the emitters are also connected together. With the collector and the base of the transistor Q5 connected to each other, the transistors Q3, Q4 and Q5 constitute a current mirror circuit with the transistor Q5 as a basis. The transistors Q5, Q4 and Q3 correspond to the current sources 11, 12 and 13 in FIG. 1, respectively, thus the first current mirror circuit 1 being constituted. The transistor Q6 is added to the first current mirror circuit, to provide the output current for external equipment. The emitters of transistors Q7 and Q8 are connected together, and the bases are also connected together. With the collector and the base of the transistor Q7 connected together, the transistors Q7 and Q8 constitute a current mirror circuit with the transistor Q7 as a basis. The current mirror circuit thus formed corresponds to the second current mirror circuit 2 made up of the current sources 21 and 22 in FIG. 1. The emitter of the transistor Q2 is connected through a constant current source 31 to the negative power source -VEE, and is grounded through a resistor R1. The collector of the transistor Q6 is connected through a constant current source 32 to the negative power source -VEE, and is grounded through a load resistor R2 as an external device. A resistor Ri connected between the input terminal IN and ground is to determine an input impedance in practical use, and it does not directly concern the present invention.

The operation of the circuit thus organized will be described.

In the circuit shown in FIG. 2, the current value I0 of the constant current source 31 is to provide a vias current for the whole circuit when the input voltage Vi is zero.

The circuit operates as described above. Therefore, when Vi=0, the voltage across the resistor R1 is zero. Accordingly, I5=0, and therefore I1=I2=I3=I4=I6=I0.

In general, with Vi≠0, the following Equation (4) is established:

$$I1=I2=I3=I4=I6=(I0+I5)=(I7+I8) \tag{4}$$

where I8 is the current flowing in the load resistor R2, and I7 is the current of the constant current source 32.

When I0 is made equal to I7 (I0=I7), then I5 is equal to I8 (I5=I8); that is, the current applied to the external load resistor R2 is proportional to the input voltage. More specifically, when the input voltage Vi is positive, I6 is larger than I7, and the difference between I6 and I7 flows in the direction of the arrow indicated at I8 in FIG. 2, and accordingly the voltage V2 at the output terminal B is positive. When, on the other hand, the input voltage Vi is negative, I6 is smaller than I7, and the difference between I6 and I7 flows in the direction opposite to the direction of the arrow indicated at I8 in FIG. 2, and therefore the voltage V2 at the output terminal B is negative. That is, the current flows from ground through the resistor R2 to the constant current source 32 as if it were absorbed by the constant current source 32. That is, the voltage-current conversion circuit handles both positive and negative input voltages.

As was described above, the voltage of the emitter A of the transistor Q2 is equal to Vi. The voltage V2 at the output terminal B is R2×I8 (V2=R2×I8), and I5=I8=Vi/R1. Therefore, in the case where the circuit is regarded as a voltage amplifier, the voltage amplification factor Av is:

$$Av = \frac{V2}{Vi} = \frac{R2 \times I8}{R1 \times I8} = \frac{R2}{R1} \quad (5)$$

Figure 5:
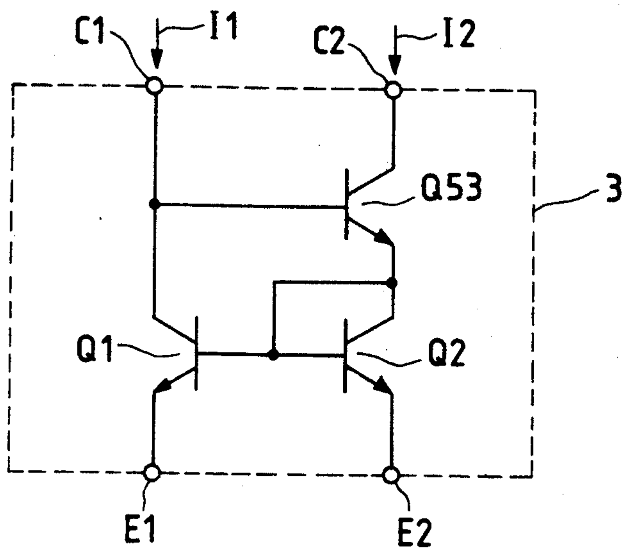
FIG. 5 is a circuit diagram showing another example of a part of the voltage-current conversion circuit according to the invention.
Figure 6:
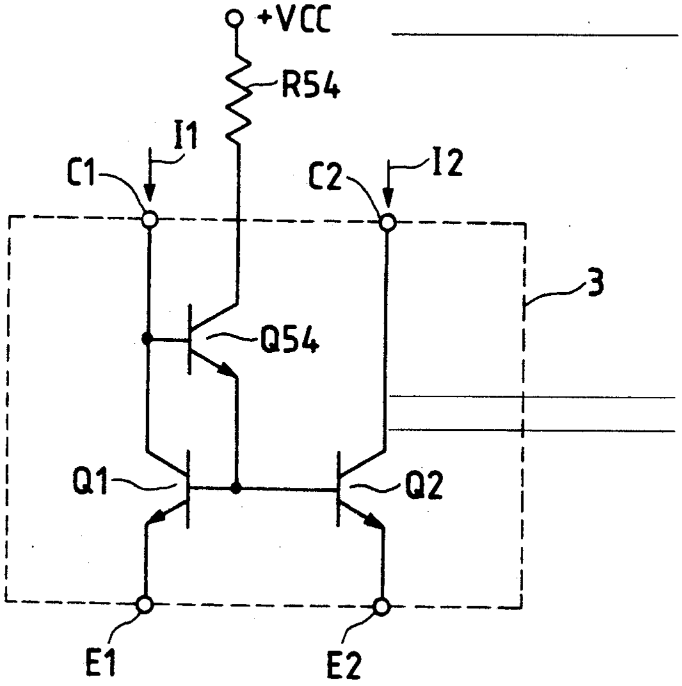
FIG. 6 is a circuit diagram showing still another example of a part of the voltage-current conversion circuit according to the invention.

As was described above, in the pair of transistors Q1 and Q2 forming the input and output sections, the voltage and current should be so selected as to form a current mirror circuit when the transistors Q1 and Q2 are equal in emitter potential; i.e., when the emitters of the transistors Q1 and Q2 are connected to each other. Therefore, the transistors which constitute an input portion and an output portion, namely the part defined by numeral 3 in FIG. 1, may be so arranged as to form a different type of current mirror circuit as shown in FIGS. 5 or 6 for instance. In each of FIGS. 5 and 6, reference characters C1, C2, E1 and E2 designate the same terminals as those in FIG. 1. These current mirror circuits operates in the same way and provide same function as that in FIG. 1.

In the above-described embodiments, the transistors Q1 and Q2 are of NPN type; however, the invention is not limited thereto or thereby. That is, instead of the NPN transistors, PNP transistors may be employed with the same effects. In this case, it goes without saying that, in order to obtain the same effects, it is necessary to replace the other transistors with transistors opposite in conduction type thereto and to invert the voltages in polarity to form the circuit.

In the circuit shown in FIG. 2, the current free from non-linear distortion is obtained through voltage-current conversion as follows: That is, the collector current I2 of the transistor Q2 is obtained through the transistor Q6 with the aid of the current mirror circuit with the transistor Q5 as a basis. However, since the currents Il, I3 and I4 are the same, the current mirror circuit may be formed on the basis of any one of the currents. For instance, a transistor may be added to form a current mirror circuit with the transistor Q7 as a basis. In this case, the load is obtained on the basis of the current I3, and the voltage-current conversion output is thereby obtained.

The voltage-current conversion circuit of the invention designed as described above is simple in arrangement. Furthermore, in the circuit, the transistors on the input and output sides are equal in emitter current, so that the current distortion is prevented which is due to the non-linearity of the base-emitter voltage. In addition, the inflow and outflow of current from the input voltage source connected to the emitter of the transistor on the input side is zeroed, so that the input impedance can be infinite.

What is claimed is:

1. A voltage-current conversion circuit comprising:

a first transistor whose emitter is employed as an input terminal, collector is connected through a first current source to a first power source and base is connected to the collector;

a second transistor whose collector is connected through a second current source to the first power source, and base is connected to the base of said first transistor, said first and second current sources constituting a first current mirror circuit in which said second current source serves as a reference;

a third current source for flowing a current equal to a current of said second current source, said third current source disposed between the emitter of said first transistor and a second power source, whereby the same current flows in the collectors and emitters of said first and second transistors, and said first and second transistors are equal in emitter potential to each other.

2. A voltage-current conversion circuit as claimed in claim 1, wherein said first and second transistors constitute a current mirror circuit in which said first transistor serves as a reference.

3. A voltage-current conversion circuit comprising:

a first transistor whose emitter is employed as an input terminal;

a second transistor whose base is connected to the base of said first transistor and whose emitter is connected to a predetermined load;

a first current mirror circuit which, with a current on the side of the collector of said second transistor as a reference, supplies currents to the side of the collector of said first transistor and to a first current source which are equal to said current on the side of the collector of said second transistor; and a second current mirror circuit which, with a current flowing in a second current source as a reference, supplies a current to the emitter of said first transistor which is equal to said current flowing in said second current source, wherein said first current source of said first current mirror circuit is connected in series to said second current source of said second current mirror circuit so that the same current flows in said first and second current sources, and wherein said first and second transistors are equal in emitter potential to each other.

4. A voltage-current conversion circuit as claimed in claim 3, wherein said first and second transistors constitute a current mirror circuit in which said first transistor serves as a reference.

* * * * *